(12) United States Patent
Khlat

(10) Patent No.: US 10,742,170 B2
(45) Date of Patent: Aug. 11, 2020

(54) ENVELOPE TRACKING CIRCUIT AND RELATED POWER AMPLIFIER SYSTEM

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/018,426

(22) Filed: Jun. 26, 2018

(65) Prior Publication Data
US 2019/0238095 A1    Aug. 1, 2019

Related U.S. Application Data

(60) Provisional application No. 62/625,137, filed on Feb. 1, 2018.

(51) Int. Cl.
| | |
|---|---|
| H03F 1/02 | (2006.01) |
| H03F 3/24 | (2006.01) |
| H03F 3/19 | (2006.01) |
| H03F 3/68 | (2006.01) |

(52) U.S. Cl.
CPC ......... *H03F 1/0233* (2013.01); *H03F 1/0222* (2013.01); *H03F 3/19* (2013.01); *H03F 3/245* (2013.01); *H03F 3/68* (2013.01); *H03F 2200/105* (2013.01); *H03F 2200/451* (2013.01)

(58) Field of Classification Search
USPC .......................... 330/297, 127, 129, 134, 279
See application file for complete search history.

(56) References Cited

U.S. PATENT DOCUMENTS

| | | | |
|---|---|---|---|
| 5,838,732 | A  | 11/1998 | Carney |
| 6,107,862 | A  | 8/2000  | Mukainakano et al. |
| 7,043,213 | B2 | 5/2006  | Robinson et al. |
| 7,471,155 | B1 | 12/2008 | Levesque |
| 7,570,931 | B2 | 8/2009  | McCallister et al. |
| 8,461,928 | B2 | 6/2013  | Yahav et al. |
| 8,718,188 | B2 | 5/2014  | Balteanu et al. |
| 8,725,218 | B2 | 5/2014  | Brown et al. |

(Continued)

OTHER PUBLICATIONS

U.S. Appl. No. 15/704,131, filed Sep. 14, 2017.
(Continued)

*Primary Examiner* — Hieu P Nguyen
(74) *Attorney, Agent, or Firm* — Withrow & Terranova, P.L.L.C.

(57) ABSTRACT

Envelope tracking circuit and related power amplifier system are provided. In one aspect, an ET circuit is configured to generate a first number of ET modulated voltages based on a second number of target voltages and output the first number of ET modulated voltages via a third number of voltage outputs. In another aspect, the ET circuit can be provided in a power amplifier system including a transceiver circuit(s) and a number of power amplifier circuits. In examples discussed herein, the ET circuit may receive the second number of target voltages from the transceiver circuit(s) and provide the first number of ET modulated voltages to the power amplifier circuits for amplifying a radio frequency (RF) signal(s). By providing the ET circuit in the power amplifier system, it is possible to flexibly enable ET power management based on any number of transceiver circuits and for any number of power amplifier circuits.

25 Claims, 6 Drawing Sheets

(56) References Cited

U.S. PATENT DOCUMENTS

| | | | |
|---|---|---|---|
| 8,774,065 | B2 | 7/2014 | Khlat et al. |
| 8,803,603 | B2 | 8/2014 | Wimpenny |
| 8,818,305 | B1 | 8/2014 | Schwent et al. |
| 8,879,665 | B2 | 11/2014 | Xia et al. |
| 8,913,690 | B2 | 12/2014 | Onishi |
| 8,989,682 | B2 | 3/2015 | Ripley et al. |
| 9,041,365 | B2 | 5/2015 | Kay et al. |
| 9,065,509 | B1 | 6/2015 | Yan et al. |
| 9,069,365 | B2 | 6/2015 | Brown et al. |
| 9,098,099 | B2 | 8/2015 | Park et al. |
| 9,166,830 | B2 | 10/2015 | Camuffo et al. |
| 9,197,182 | B2 | 11/2015 | Baxter et al. |
| 9,225,362 | B2 | 12/2015 | Drogi et al. |
| 9,263,997 | B2 | 2/2016 | Vinayak |
| 9,270,239 | B2 | 2/2016 | Drogi et al. |
| 9,280,163 | B2 | 3/2016 | Kay et al. |
| 9,288,098 | B2 | 3/2016 | Yan et al. |
| 9,344,304 | B1 | 5/2016 | Cohen |
| 9,356,512 | B2 | 5/2016 | Chowdhury et al. |
| 9,515,622 | B2 * | 12/2016 | Nentwig ............... H03F 3/211 |
| 9,520,907 | B2 | 12/2016 | Peng et al. |
| 9,584,071 | B2 | 2/2017 | Khlat |
| 9,595,981 | B2 | 3/2017 | Khlat |
| 9,596,110 | B2 | 3/2017 | Jiang et al. |
| 9,614,477 | B1 | 4/2017 | Rozenblit et al. |
| 9,748,845 | B1 | 8/2017 | Kotikalapoodi |
| 9,806,676 | B2 | 10/2017 | Balteanu et al. |
| 9,831,834 | B2 | 11/2017 | Balteanu et al. |
| 9,837,962 | B2 | 12/2017 | Mathe et al. |
| 9,923,520 | B1 | 3/2018 | Abdelfattah et al. |
| 10,003,416 | B1 | 6/2018 | Lloyd |
| 10,110,169 | B2 | 10/2018 | Khesbak et al. |
| 10,170,989 | B2 | 1/2019 | Balteanu et al. |
| 2002/0167827 | A1 | 11/2002 | Umeda et al. |
| 2004/0266366 | A1 | 12/2004 | Robinson et al. |
| 2005/0090209 | A1 | 4/2005 | Behzad |
| 2005/0227646 | A1 | 10/2005 | Yamazaki et al. |
| 2005/0232385 | A1 | 10/2005 | Yoshikawa et al. |
| 2006/0240786 | A1 | 10/2006 | Liu |
| 2007/0052474 | A1 | 3/2007 | Saito |
| 2007/0258602 | A1 | 11/2007 | Vepsalainen et al. |
| 2009/0016085 | A1 | 1/2009 | Rader et al. |
| 2009/0045872 | A1 | 2/2009 | Kenington |
| 2010/0308919 | A1 | 12/2010 | Adamski et al. |
| 2011/0074373 | A1 | 3/2011 | Lin |
| 2011/0136452 | A1 | 6/2011 | Pratt et al. |
| 2011/0175681 | A1 | 7/2011 | Inamori et al. |
| 2011/0279179 | A1 | 11/2011 | Vice |
| 2012/0194274 | A1 | 8/2012 | Fowers et al. |
| 2012/0200435 | A1 | 8/2012 | Ngo et al. |
| 2012/0299645 | A1 | 11/2012 | Southcombe et al. |
| 2012/0299647 | A1 | 11/2012 | Honjo et al. |
| 2013/0021827 | A1 | 1/2013 | Ye |
| 2013/0100991 | A1 | 4/2013 | Woo |
| 2013/0130724 | A1 | 5/2013 | Kumar Reddy et al. |
| 2013/0162233 | A1 | 6/2013 | Marty |
| 2013/0187711 | A1 | 7/2013 | Goedken et al. |
| 2013/0200865 | A1 | 8/2013 | Wimpenny |
| 2014/0009226 | A1 | 1/2014 | Severson |
| 2014/0028370 | A1 | 1/2014 | Wimpenny |
| 2014/0028390 | A1 | 1/2014 | Davis |
| 2014/0103995 | A1 | 4/2014 | Langer |
| 2014/0155002 | A1 | 6/2014 | Dakshinamurthy et al. |
| 2014/0184335 | A1 | 7/2014 | Nobbe et al. |
| 2014/0199949 | A1 | 7/2014 | Nagode et al. |
| 2014/0210550 | A1 | 7/2014 | Mathe et al. |
| 2014/0218109 | A1 | 8/2014 | Wimpenny |
| 2014/0235185 | A1 | 8/2014 | Drogi |
| 2014/0266423 | A1 | 9/2014 | Drogi et al. |
| 2014/0266428 | A1 | 9/2014 | Chiron et al. |
| 2014/0315504 | A1 | 10/2014 | Sakai et al. |
| 2014/0361830 | A1 | 12/2014 | Mathe et al. |
| 2015/0071382 | A1 | 3/2015 | Wu et al. |
| 2015/0098523 | A1 | 4/2015 | Lim et al. |
| 2015/0188432 | A1 | 7/2015 | Vannorsdel et al. |
| 2015/0236654 | A1 | 8/2015 | Jiang et al. |
| 2015/0236729 | A1 | 8/2015 | Peng et al. |
| 2015/0280652 | A1 | 10/2015 | Cohen |
| 2015/0333781 | A1 | 11/2015 | Alon et al. |
| 2016/0065137 | A1 | 3/2016 | Khlat |
| 2016/0099687 | A1 | 4/2016 | Khlat |
| 2016/0105151 | A1 | 4/2016 | Langer |
| 2016/0118941 | A1 | 4/2016 | Wang |
| 2016/0173031 | A1 | 6/2016 | Langer |
| 2016/0187627 | A1 | 6/2016 | Abe |
| 2016/0197627 | A1 | 7/2016 | Qin et al. |
| 2016/0294587 | A1 | 10/2016 | Jiang et al. |
| 2017/0141736 | A1 | 5/2017 | Pratt et al. |
| 2017/0302183 | A1 | 10/2017 | Young |
| 2017/0317913 | A1 | 11/2017 | Kim et al. |
| 2017/0338773 | A1 | 11/2017 | Balteanu et al. |
| 2018/0048265 | A1 | 2/2018 | Nentwig |
| 2018/0048276 | A1 | 2/2018 | Khlat et al. |
| 2018/0076772 | A1 | 3/2018 | Khesbak et al. |
| 2018/0288697 | A1 | 10/2018 | Camuffo et al. |
| 2018/0302042 | A1 | 10/2018 | Zhang et al. |
| 2018/0309414 | A1 | 10/2018 | Khlat et al. |
| 2018/0367101 | A1 | 12/2018 | Chen et al. |
| 2019/0097277 | A1 | 3/2019 | Fukae |

OTHER PUBLICATIONS

U.S. Appl. No. 15/728,202, filed Oct. 9, 2017.
U.S. Appl. No. 15/792,909, filed Oct. 25, 2017.
U.S. Appl. No. 15/888,260, filed Feb. 5, 2018.
U.S. Appl. No. 15/888,300, filed Feb. 5, 2018.
U.S. Appl. No. 15/984,566, filed May 21, 2018.
U.S. Appl. No. 15/986,948, filed May 23, 2018.
U.S. Appl. No. 15/902,244, filed Feb. 22, 2018.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Final Office Action for U.S. Appl. No. 15/888,300, dated Feb. 15, 2019, 15 pages.
Non-Final Office Action for U.S. Appl. No. 15/986,948, dated Mar. 28, 2019, 8 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Pfister, Henry, "Discrete-Time Signal Processing," Lecture Note, pfister.ee.duke.edu/courses/ece485/dtsp.pdf, Mar. 3, 2017, 22 pages.
Advisory Action for U.S. Appl. No. 15/888,300, dated Jun. 5, 2019, 3 pages.
Non-Final Office Action for U.S. Appl. No. 15/888,260, dated May 2, 2019, 14 pages.
Notice of Allowance for U.S. Appl. No. 15/984,566, dated May 21, 2019, 6 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.

(56) References Cited

OTHER PUBLICATIONS

Notice of Allowance for U.S. Appl. No. 15/888,300, dated Jan. 14, 2020, 11 pages.
Notice of Allowance for U.S. Appl. No. 16/180,887, dated Jan. 13, 2020, 8 pages.
Final Office Action for U.S. Appl. No. 15/986,948, dated Aug. 27, 2019, 9 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Notice of Allowance for U.S. Appl. No. 16/354,234, dated Apr. 24, 2020, 9 pages.

\* cited by examiner

ENVELOPE TRACKING CIRCUIT AND RELATED POWER AMPLIFIER SYSTEM

RELATED APPLICATIONS

This application claims the benefit of provisional patent application Ser. No. 62/625,137, filed Feb. 1, 2018, the disclosure of which is hereby incorporated herein by reference in its entirety.

FIELD OF THE DISCLOSURE

The technology of the disclosure relates generally to envelope tracking power amplifier circuits and systems.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth generation new radio (5G-NR) and Wi-Fi that typically operates in higher frequency spectrums. In this regard, a mobile communication may employ a number of different transceiver circuits to concurrently support a number of different wireless communication technologies. To achieve higher data rates with increased robustness in the higher frequency spectrums, the mobile communication devices may also employ multiple antennas to enable multiple-input multiple-output (MIMO) and/or beamforming operations. Sophisticated power amplifier circuits may be employed to increase output power of radio frequency (RF) signals (e.g., maintaining sufficient energy per bit) prior to transmitting the RF signals from the multiple antennas. However, the increased number of transceiver circuits, antennas, and power amplifier circuits can lead to increased power dissipation in the mobile communication devices, thus compromising overall performance and user experiences.

Envelope tracking (ET) is a power management technology designed to improve efficiency levels of the power amplifier circuits to help reduce power dissipation in the mobile communication device. As the name suggests, an ET system receives an ET target voltage(s), which may be generated by the different transceiver circuits, and generates an ET modulated voltage(s) based on the ET target voltage(s). Accordingly, the power amplifier circuits can be configured to amplify the RF signals based on the ET modulated voltage(s). In this regard, it may be desirable to employ highly flexible power management architecture to support the different transceiver circuits, the antennas, and the power amplifier circuits in the mobile communication device for improved efficiency and performance.

SUMMARY

Embodiments of the disclosure relate to an envelope tracking (ET) circuit and related power amplifier system. In one aspect, an ET circuit is configured to generate a first number of ET modulated voltages based on a second number of target voltages and output the first number of ET modulated voltages via a third number of voltage outputs. In another aspect, the ET circuit can be provided in a power amplifier system including a transceiver circuit(s) and a number of power amplifier circuits. In examples discussed herein, the ET circuit may receive the second number of target voltages from the transceiver circuit(s) and provide the first number of ET modulated voltages to the power amplifier circuits for amplifying a radio frequency (RF) signal(s). By providing the ET circuit in the power amplifier system, it is possible to flexibly enable ET power management based on any number of transceiver circuits and for any number of power amplifier circuits.

In one aspect, an ET circuit is provided. The ET circuit includes an ET voltage circuit. The ET voltage circuit includes a first number of tracker circuits configured to generate a first number of ET modulated voltages. The ET voltage circuit also includes a second number of voltage inputs configured to receive a second number of target voltages. The ET voltage circuit also includes a third number of voltage outputs configured to output the first number of ET modulated voltages. The ET circuit also includes a control circuit. The control circuit is configured to couple a selected number of tracker circuits among the first number of tracker circuits to a selected number of voltage inputs among the second number of voltage inputs. The selected number of tracker circuits is configured to receive a selected number of target voltages among the second number of target voltages via the selected number of voltage inputs. The selected number of tracker circuits is also configured to generate a selected number of ET modulated voltages among the first number of ET modulated voltages based on the selected number of target voltages. The control circuit is also configured to selectively provide the selected number of ET modulated voltages to the third number of voltage outputs.

In another aspect, a power amplifier system is provided. The power amplifier system includes an ET circuit. The ET circuit includes an ET voltage circuit. The ET voltage circuit includes a first number of tracker circuits configured to generate a first number of ET modulated voltages. The ET voltage circuit also includes a second number of voltage inputs configured to receive a second number of target voltages. The ET voltage circuit also includes a third number of voltage outputs configured to output the first number of ET modulated voltages. The ET circuit also includes a control circuit. The control circuit is configured to couple a selected number of tracker circuits among the first number of tracker circuits to a selected number of voltage inputs among the second number of voltage inputs. The selected number of tracker circuits is configured to receive a selected number of target voltages among the second number of target voltages via the selected number of voltage inputs. The selected number of tracker circuits is also configured to generate a selected number of ET modulated voltages among the first number of ET modulated voltages based on the selected number of target voltages. The control circuit is also configured to selectively provide the selected number of ET modulated voltages to the third number of voltage outputs. The power amplifier system also includes a number of power amplifier circuits coupled to the third number of voltage outputs each configured to amplify an RF signal based on an ET modulated voltage among the first number of ET modulated voltages.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
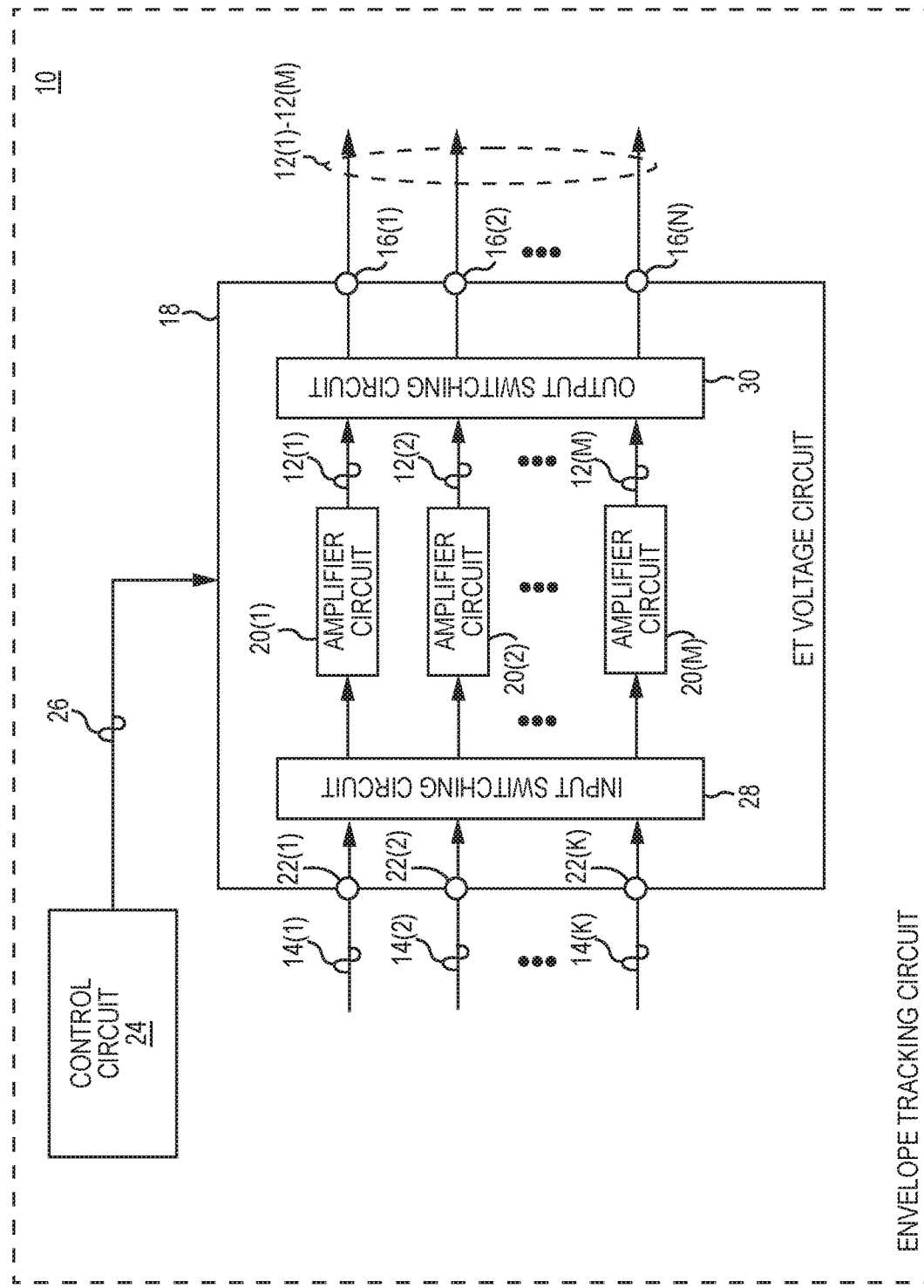
FIG. 1 is a schematic diagram of an exemplary envelope tracking (ET) circuit, which can be configured flexibly to generate a first number of ET modulated voltages based on a second number of target voltages and output the first number of ET modulated voltages via a third number of voltage outputs.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) circuit and related power amplifier system. In one aspect, an ET circuit is configured to generate a first number of ET modulated voltages based on a second number of target voltages and output the first number of ET modulated voltages via a third number of voltage outputs. In another aspect, the ET circuit can be provided in a power amplifier system including a transceiver circuit(s) and a number of power amplifier circuits. In examples discussed herein, the ET circuit may receive the second number of target voltages from the transceiver circuit(s) and provide the first number of ET modulated voltages to the power amplifier circuits for amplifying a radio frequency (RF) signal(s). By providing the ET circuit in the power amplifier system, it is possible to flexibly enable ET power management based on any number of transceiver circuits and for any number of power amplifier circuits.

In this regard, FIG. 1 is a schematic diagram of an exemplary ET circuit 10, which can be configured flexibly to generate a first number of ET modulated voltages 12(1)-12(M) based on a second number of target voltages 14(1)-14(K) and output the first number of ET modulated voltages 12(1)-12(M) via a third number of voltage outputs 16(1)-16(N). As is discussed later in FIGS. 3-6, the ET circuit 10 can be employed in an ET power amplifier system to flexibly enable ET power management based on any number of transceiver circuits and for any number of power amplifier circuits.

The ET circuit 10 includes an ET voltage circuit 18. The ET voltage circuit 18 includes a first number of tracker circuits 20(1)-20(M) and a second number of voltage inputs 22(1)-22K). The second number of voltage inputs 22(1)-22(K) is configured to receive the second number of target voltages 14(1)-14(K), respectively. The first number of tracker circuits 20(1)-20(M) is configured to generate the first number of ET modulated voltages 12(1)-12(M) based on the second number of target voltages 14(1)-14(K).

The ET circuit 10 includes a control circuit 24, which can be a microprocessor, a microcontroller, or a field-programmable gate array (FPGA) for example. The ET circuit 10 can be configured to control the ET voltage circuit 18 via a control signal 26. Notably, the first number of tracker circuits 20(1)-20(M) may not be equal to the second number of voltage inputs 22(1)-22(K). In this regard, the control circuit 24 may be configured to couple a selected number of tracker circuits among the first number of tracker circuits 20(1)-20(M) to a selected number of voltage inputs among the second number of voltage inputs 22(1)-22(K) to receive a selected number of target voltages among the second number of target voltages 14(1)-14(K). Accordingly, the selected number of tracker circuits can generate a selected number of ET modulated voltages among the first number of ET modulated voltages 12(1)-12(M) based on the selected number of target voltages. The control circuit 24 is further configured to selectively provide the selected number of ET modulated voltages to the third number of voltage outputs 16(1)-16(M).

The ET voltage circuit 18 may include an input switching circuit 28 coupled between the first number of tracker circuits 20(1)-20(M) and the second number of voltage inputs 22(1)-22(K). In this regard, the control circuit 24 may control the input switching circuit 28 to couple the selected number of tracker circuits to the selected number of voltage inputs. The input switching circuit 28 may be implemented based any suitable number and type of switches.

The ET voltage circuit 18 may include an output switching circuit 30 coupled between the first number of tracker circuits 20(1)-20(M) and the third number of voltage outputs 16(1)-16(N). In this regard, the control circuit 24 may control the output switching circuit 30 to couple the selected number of tracker circuits to the third number of voltage outputs 16(1)-16(N). The output switching circuit 30 may be implemented based any suitable number and type of switches.

In one non-limiting example, the second number of voltage inputs 22(1)-22(K) are more than the first number of tracker circuits 20(1)-20(M) (K>M). In this regard, the control circuit 24 can control the input switching circuit 28 to couple the first number of tracker circuits 20(1)-20(M) to a selected subset of the second number of voltage inputs 22(1)-22(K) (e.g., M out of K voltage inputs) to receive a selected subset of the target voltages 14(1)-14(K) (e.g., M out of K target voltages). Accordingly, the first number of tracker circuits 20(1)-20(M) can generate the first number of ET modulated voltages based on the selected subset of the target voltages 14(1)-14(K).

In another non-limiting example, the second number of voltage inputs 22(1)-22(K) are less than the first number of tracker circuits 20(1)-20(M) (K<M). In this regard, the control circuit 24 can activate a selected subset of the first number of tracker circuits 20(1)-20(M) (e.g., K out of M tracker circuits). The control circuit 24 further controls the input switching circuit 28 to couple the selected subset of the first number of tracker circuits 20(1)-20(M) to the second number of voltage inputs 22(1)-22(K) to receive the second number of target voltages 14(1)-14(K). Accordingly, the selected subset of the first number of tracker circuits 20(1)-20(M) generates a selected subset of the first number of ET modulated voltages 12(1)-12(M) (e.g., K out of M ET modulated voltages).

In another non-limiting example, the first number of tracker circuits 20(1)-20(M) equals the second number of voltage inputs 22(1)-22(K) (K=M). In this regard, the control circuit 24 can control the input switching circuit 28 to couple the first number of tracker circuits 20(1)-20(M) to the second number of voltage inputs 22(1)-22(K) to receive the second number of target voltages 14(1)-14(K). Accordingly, the first number of tracker circuits 20(1)-20(M) generates the first number of ET modulated voltages 12(1)-12(M) based on the second number of target voltages 14(1)-14(K).

In another non-limiting example, the first number of tracker circuits 20(1)-20(M) equals the third number of voltage outputs 16(1)-16(N) (M=N). In this regard, the control circuit 24 controls the output switching circuit 30 to couple the first number of tracker circuits 20(1)-20(M) to the third number of voltage outputs 16(1)-16(N) to output the first number of ET modulated voltages 12(1)-12(M).

Figure 2:
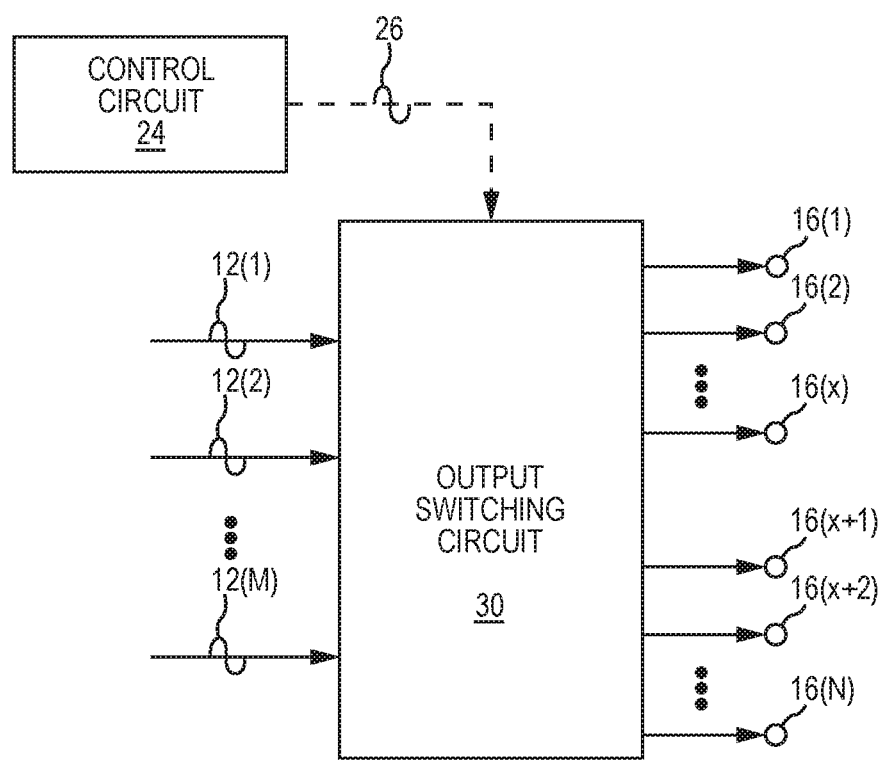
FIG. 2 is a schematic diagram providing an exemplary illustration of an output switching circuit in the ET circuit of FIG. 1 configured to output a lesser number of ET modulated voltages to a larger number of voltage outputs.

Notably, the third number of voltage outputs 16(1)-16(N) can be more than the first number of tracker circuits 20(1)-20(M) (N>M). In this regard, FIG. 2 is a schematic diagram providing an exemplary illustration of the output switching circuit 30 of FIG. 1 configured to output a lesser number of ET modulated voltages to a larger number of voltage outputs. Common elements between FIGS. 1 and 2 are shown therein with common element numbers and will not be re-described herein.

As shown in FIG. 2, the third number of voltage outputs 16(1)-16(N) includes a plurality of primary voltage outputs 16(1)-16(X) (X<N) and a plurality of auxiliary voltage outputs 16(X+1)-16(N). In this regard, the control circuit 24 can control the output switching circuit 30 to couple one or more of the first number of tracker circuits 20(1)-20(M) to one or more selected primary voltage outputs among the primary voltage outputs 16(1)-16(X). The control circuit 24 can further control the output switching circuit 30 to couple one or more of the first number of tracker circuits 20(1)-20(M) to one or more selected auxiliary voltage outputs among the auxiliary voltage outputs 16(X+1)-16(M).

Figure 3:
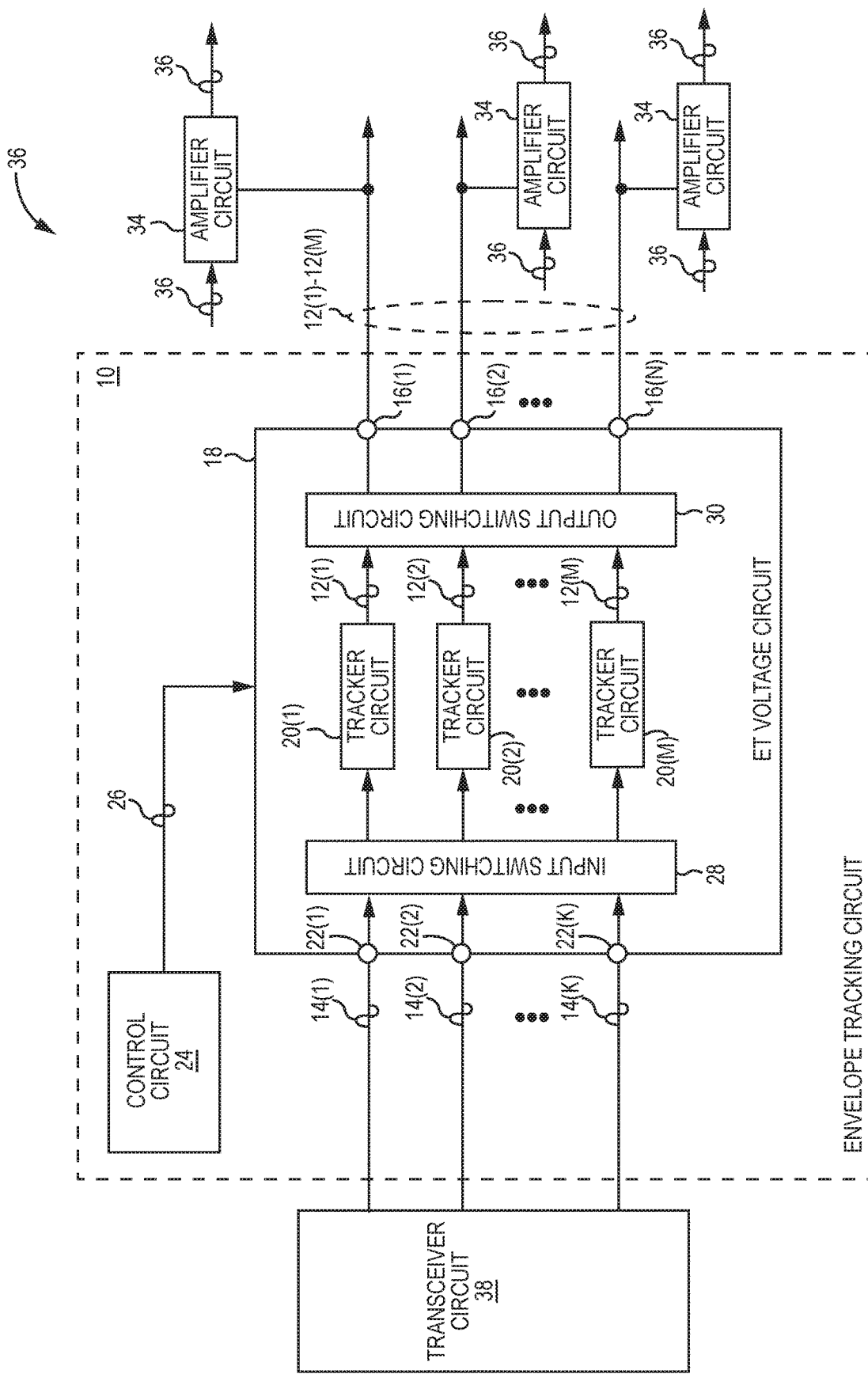
FIG. 3 is a schematic diagram of an exemplary power amplifier system configured to include the ET circuit of FIG. 1 according to one embodiment of the present disclosure.

The ET circuit 10 of FIG. 1 can be employed in an ET power amplifier system to flexibly enable ET power management based on any number of transceiver circuits and for any number of power amplifier circuits. In this regard, FIG. 3 is a schematic diagram of an exemplary power amplifier system 32 configured to include the ET circuit 10 of FIG. 1 according to one embodiment of the present disclosure. Common elements between FIGS. 1 and 3 are shown therein with common element numbers and will not be re-described herein.

The power amplifier system 32 includes a number of amplifier circuits 34 that are coupled to the third number of voltage outputs 16(1)-16(N). Each of the amplifier circuits 34 is configured to amplify a radio frequency (RF) signal 36 based on an ET modulated voltage among the ET modulated voltages 12(1)-12(M). Although FIG. 3 shows that only one amplifier circuit is coupled to each of the third number of voltage outputs 16(1)-16(N), it should be appreciated that more than one of the amplifier circuits 34 can be coupled to each of the third number of voltage outputs 16(1)-16(N). It should also be appreciated that the amplifier circuits 34 may be configured to receive an identical or different ET modulate voltage among the ET modulated voltages 12(1)-12(M). It should be further appreciated that the amplifier circuits 34 may amplify identical or different RF signals, either individually or concurrently.

The power amplifier system 32 includes a transceiver circuit 38. The transceiver circuit 38 is configured to provide the second number of target voltages 14(1)-14(K) to the second number of voltage inputs 22(1)-22(K).

Figure 4:
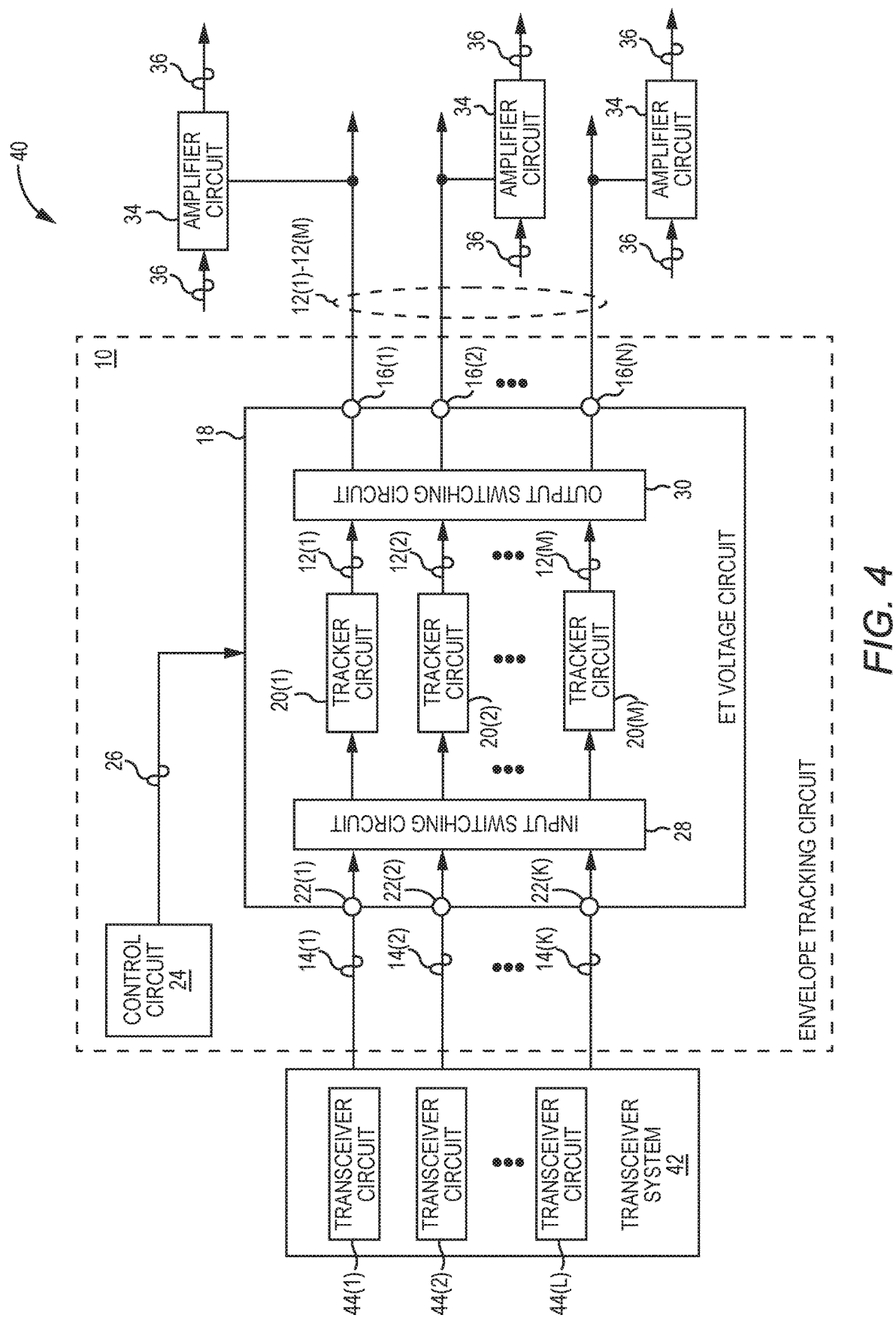
FIG. 4 is a schematic diagram of an exemplary power amplifier system configured to include the ET circuit of FIG. 1 according to another embodiment of the present disclosure.

The power amplifier system 32 may be adapted to include more than one transceiver circuit, as discussed next in FIG. 4. In this regard, FIG. 4 is a schematic diagram of an exemplary power amplifier system 40 configured to include the ET circuit 10 of FIG. 1 according to another embodiment of the present disclosure. Common elements between FIGS. 3 and 4 are shown therein with common element numbers and will not be re-described herein.

The power amplifier system 40 includes a transceiver system 42, which includes a number of transceiver circuits 44(1)-44(L). The transceiver circuits 44(1)-44(L) may be configured to support a variety of wireless communication technologies, including but not limited to long-term evolution (LTE), fifth-generation new radio (5G-NR), and Wi-Fi. The transceiver circuits 44(1)-44(L) may be configured to collectively provide the second number of target voltages 14(1)-14(K) to the second number of voltage inputs 22(1)-22(K).

Figure 5:
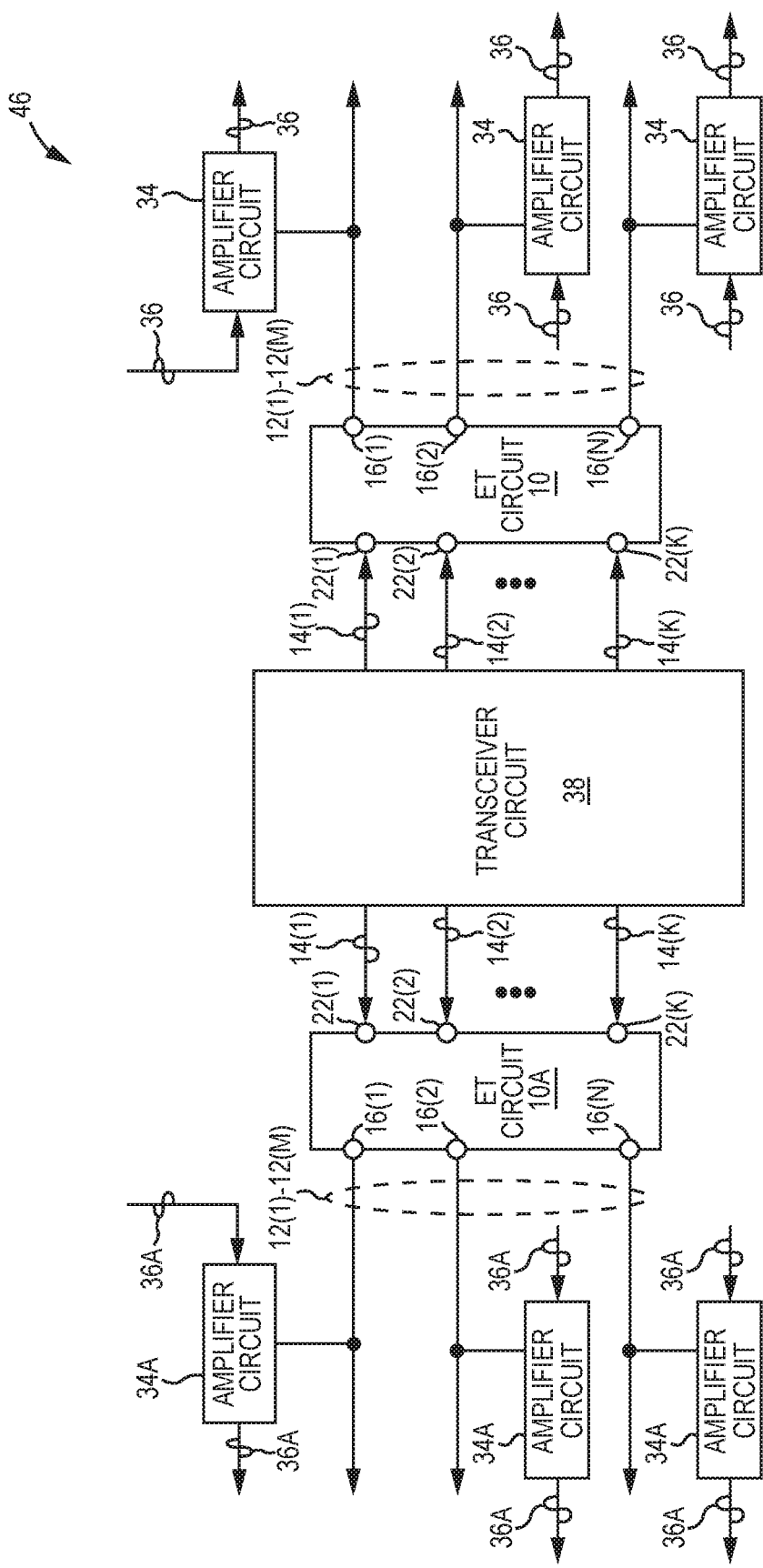
FIG. 5 is a schematic diagram of an exemplary power amplifier system configured to include at least two of the ET circuit of FIG. 1 according to one embodiment of the present disclosure.

The power amplifier system 32 of FIG. 3 can be adapted to include more than one ET circuit 10. In this regard, FIG. 5 is a schematic diagram of an exemplary power amplifier system 46 configured to include at least two of the ET circuit 10 of FIG. 1 according to one embodiment of the present disclosure. Common elements between FIGS. 3 and 5 are shown therein with common element numbers and will not be re-described herein.

The power amplifier system 46 includes at least one second ET circuit 10A that is functionally equivalent to the ET circuit 10 of FIG. 1. Like the ET circuit 10, the second ET circuit 10A is coupled to the transceiver circuit 38 to receive the second number of target voltages 14(1)-14(K). Accordingly, the second ET circuit 10A outputs the first number of ET modulated voltages 12(1)-12(M) via the third number of voltage outputs 16(1)-16(N). The power amplifier system 46 may include a number of second amplifier circuits 34A coupled to the second ET circuit 10A. The second amplifier circuits 34A are configured to amplify a number of RF signals 36A based on the first number of ET modulated voltages 12(1)-12(M).

Figure 6:
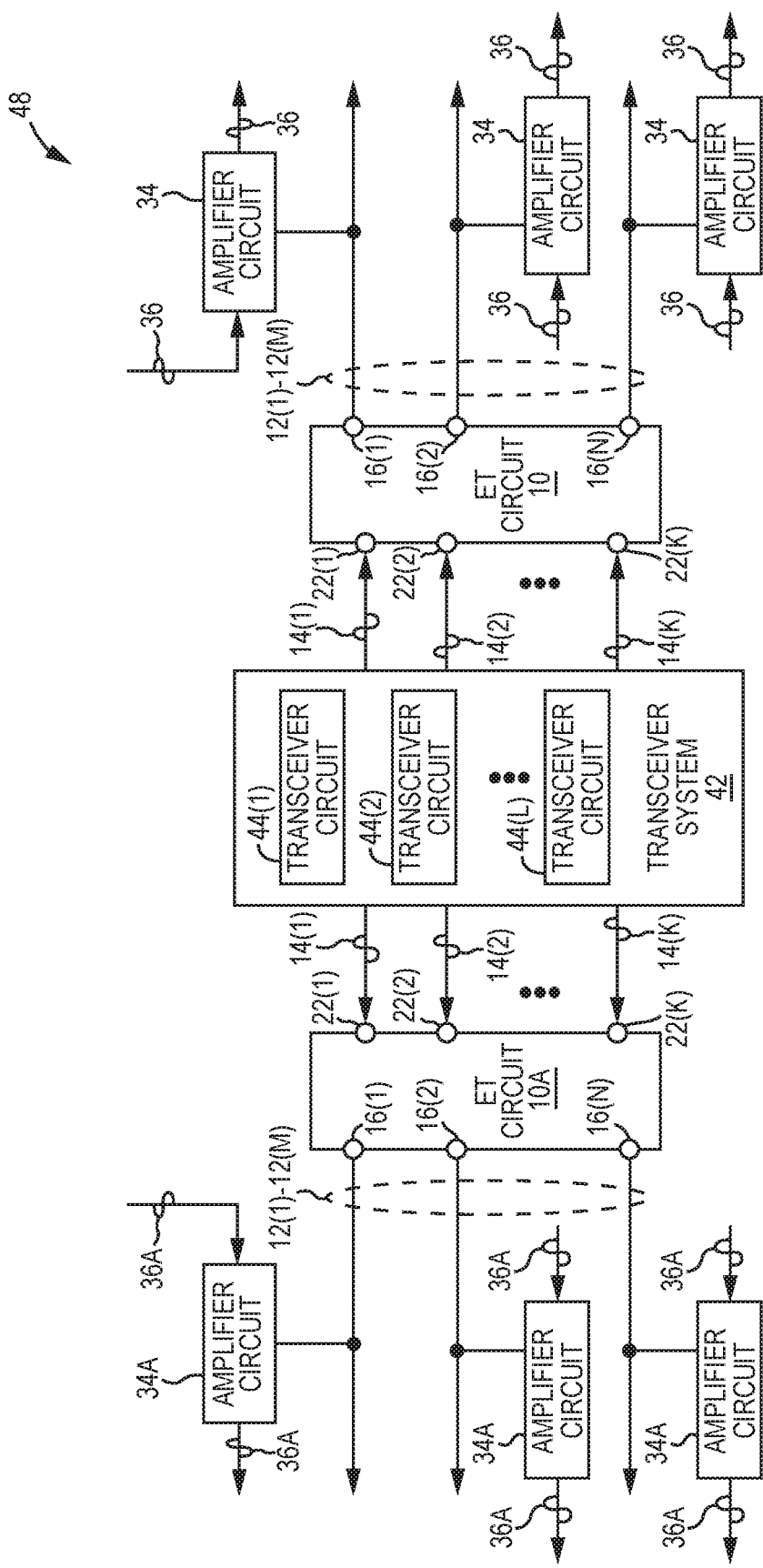
FIG. 6 is a schematic diagram of an exemplary power amplifier system configured to include at least two of the ET circuit of FIG. 1 according to another embodiment of the present disclosure.

The power amplifier system 40 of FIG. 4 can also be adapted to include more than one ET circuit 10. In this regard, FIG. 6 is a schematic diagram of an exemplary power amplifier system 48 configured to include at least two of the ET circuit 10 of FIG. 1 according to another embodiment of the present disclosure. Common elements between FIGS. 3, 5, and 6 are shown therein with common element numbers and will not be re-described herein.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) circuit comprising:
an ET voltage circuit comprising:
a first number of tracker circuits configured to generate a first number of ET modulated voltages;
a second number of voltage inputs configured to receive a second number of target voltages, wherein the second number of voltage inputs does not equal the first number of tracker circuits; and
a third number of voltage outputs configured to output the first number of ET modulated voltages; and
a control circuit configured to:
couple a selected number of tracker circuits among the first number of tracker circuits to a selected number of voltage inputs among the second number of voltage inputs, wherein the selected number of tracker circuits is configured to:
receive a selected number of target voltages among the second number of target voltages via the selected number of voltage inputs; and
generate a selected number of ET modulated voltages among the first number of ET modulated voltages based on the selected number of target voltages; and
selectively provide the selected number of ET modulated voltages to the third number of voltage outputs.

2. The ET circuit of claim 1 wherein:
the ET voltage circuit further comprises an input switching circuit coupled between the first number of tracker circuits and the second number of voltage inputs; and
the control circuit is further configured to control the input switching circuit to couple the selected number of tracker circuits to the selected number of voltage inputs.

3. The ET circuit of claim 1 wherein:
the ET voltage circuit further comprises an output switching circuit coupled between the first number of tracker circuits and the third number of voltage outputs; and
the control circuit is further configured to control the output switching circuit to selectively provide the selected number of ET modulated voltages to the third number of voltage outputs.

4. The ET circuit of claim 1 wherein the control circuit is further configured to couple the first number of tracker circuits to a selected subset of the second number of voltage inputs in response to the first number of tracker circuits being less than the second number of voltage inputs.

5. The ET circuit of claim 1 wherein the control circuit is further configured to activate and couple a selected subset of the first number of tracker circuits to the second number of voltage inputs in response to the first number of tracker circuits being greater than the second number of voltage inputs.

6. The ET circuit of claim 1 wherein the control circuit is further configured to couple the first number of tracker circuits to the third number of voltage outputs, respectively, in response to the first number of tracker circuits being equal to the third number of voltage outputs.

7. The ET circuit of claim 1 wherein:
the third number of voltage outputs comprises a plurality of primary voltage outputs and a plurality of auxiliary voltage outputs; and
the control circuit is further configured to:
couple one or more of the first number of tracker circuits to one or more selected primary voltage outputs among the plurality of primary voltage outputs; and
couple one or more of the first number of tracker circuits to one or more selected auxiliary voltage outputs among the plurality of auxiliary voltage outputs.

8. The ET circuit of claim 1 wherein:
the ET voltage circuit further comprises:
an input switching circuit coupled between the first number of tracker circuits and the second number of voltage inputs; and
an output switching circuit coupled between the first number of tracker circuits and the third number of voltage outputs; and
the control circuit is further configured to:
control the input switching circuit to couple the selected number of tracker circuits to the selected number of voltage inputs; and
control the output switching circuit to selectively provide the selected number of ET modulated voltages to the third number of voltage outputs.

9. The ET circuit of claim 8 wherein the control circuit is further configured to control the input switching circuit to couple the first number of tracker circuits to a selected subset of the second number of voltage inputs in response to the first number of tracker circuits being lesser than the second number of voltage inputs.

10. The ET circuit of claim 8 wherein the control circuit is further configured to activate a selected subset of the first number of tracker circuits and control the input switching circuit to couple the selected subset of the first number of tracker circuits to the second number of voltage inputs in response to the first number of tracker circuits being greater than the second number of voltage inputs.

11. The ET circuit of claim 8 wherein the control circuit is further configured to control the output switching circuit to couple the first number of tracker circuits to the third number of voltage outputs, respectively, in response to the first number of tracker circuits being equal to the third number of voltage outputs.

12. The ET circuit of claim 8 wherein:
the third number of voltage outputs comprises a plurality of primary voltage outputs and a plurality of auxiliary voltage outputs; and
the control circuit is further configured to:
control the output switching circuit to couple one or more of the first number of tracker circuits to one or more selected primary voltage outputs among the plurality of primary voltage outputs; and
control the output switching circuit to couple one or more of the first number of tracker circuits to one or more selected auxiliary voltage outputs among the plurality of auxiliary voltage outputs.

13. A power amplifier system comprising:
an envelope tracking (ET) circuit comprising:
an ET voltage circuit comprising:
a first number of tracker circuits configured to generate a first number of ET modulated voltages;
a second number of voltage inputs configured to receive a second number of target voltages, wherein the second number of voltage inputs does not equal the first number of tracker circuits; and
a third number of voltage outputs configured to output the first number of ET modulated voltages; and
a control circuit configured to:
couple a selected number of tracker circuits among the first number of tracker circuits to a selected number of voltage inputs among the second number of voltage inputs, wherein the selected number of tracker circuits is configured to:
receive a selected number of target voltages among the second number of target voltages via the selected number of voltage inputs; and
generate a selected number of ET modulated voltages among the first number of ET modulated voltages based on the selected number of target voltages; and
selectively provide the selected number of ET modulated voltages to the third number of voltage outputs; and
a plurality of power amplifier circuits coupled to the third number of voltage outputs each configured to amplify a radio frequency (RF) signal based on an ET modulated voltage among the first number of ET modulated voltages.

14. The power amplifier system of claim 13 wherein each of the third number of voltage outputs is coupled to one or more of the plurality of power amplifier circuits.

15. The power amplifier system of claim 13 wherein:
the ET voltage circuit further comprises an input switching circuit coupled between the first number of tracker circuits and the second number of voltage inputs; and
the control circuit is further configured to control the input switching circuit to couple the selected number of tracker circuits to the selected number of voltage inputs.

16. The power amplifier system of claim 13 wherein:
the ET voltage circuit further comprises an output switching circuit coupled between the first number of tracker circuits and the third number of voltage outputs; and
the control circuit is further configured to control the output switching circuit to selectively provide the selected number of ET modulated voltages to the third number of voltage outputs.

17. The power amplifier system of claim 13 wherein the control circuit is further configured to couple the first number of tracker circuits to a selected subset of the second number of voltage inputs in response to the first number of tracker circuits being less than the second number of voltage inputs.

18. The power amplifier system of claim 13 wherein the control circuit is further configured to activate and couple a selected subset of the first number of tracker circuits to the second number of voltage inputs in response to the first number of tracker circuits being greater than the second number of voltage inputs.

19. The power amplifier system of claim 13 wherein the control circuit is further configured to couple the first number of tracker circuits to the third number of voltage outputs, respectively, in response to the first number of tracker circuits being equal to the third number of voltage outputs.

20. The power amplifier system of claim 13 wherein:
the third number of voltage outputs comprises a plurality of primary voltage outputs and a plurality of auxiliary voltage outputs; and
the control circuit is further configured to:
couple one or more of the first number of tracker circuits to one or more selected primary voltage outputs among the plurality of primary voltage outputs; and
couple one or more of the first number of tracker circuits to one or more selected auxiliary voltage outputs among the plurality of auxiliary voltage outputs.

21. The power amplifier system of claim 13 further comprising a transceiver circuit configured to provide the second number of target voltages to the second number of voltage inputs.

22. The power amplifier system of claim 21 further comprising a second ET circuit coupled to the transceiver circuit and configured to receive the second number of target voltages and output the first number of ET modulated voltages via the third number of voltage outputs.

23. The power amplifier system of claim 22 further comprising a plurality of second amplifier circuits coupled to the second ET circuit.

24. The power amplifier system of claim 13 further comprising a transceiver system comprising a plurality of transceiver circuits configured to collectively provide the second number of target voltages to the second number of voltage inputs.

25. The power amplifier system of claim 24 further comprising a second ET circuit coupled to the transceiver system and configured to receive the second number of target voltages and output the first number of ET modulated voltages via the third number of voltage outputs.

* * * * *